/

US008518489B2

(12) United States Patent  
Shin et al.

(10) Patent No.: US 8,518,489 B2  
(45) Date of Patent: *Aug. 27, 2013

(54) METHOD FOR MAKING FINE PATTERNS USING MASK TEMPLATE

(75) Inventors: Dong-Youn Shin, Daejeon (KR); Taik-Min Lee, Daejeon (KR); Dong-Soo Kim, Daejeon (KR)

(73) Assignee: Korea Institute of Machinery and Materials (KR)

( * ) Notice: Subject to any disclaimer, the term of this patent is extended or adjusted under 35 U.S.C. 154(b) by 343 days.

This patent is subject to a terminal disclaimer.

(21) Appl. No.: 12/801,699

(22) Filed: Jun. 22, 2010

(65) Prior Publication Data

US 2010/0323122 A1 Dec. 23, 2010

(30) Foreign Application Priority Data

Jun. 22, 2009 (KR) ........................ 10-2009-0055437

(51) Int. Cl.
*B05D 1/32* (2006.01)
*B05D 1/36* (2006.01)
*B05D 5/00* (2006.01)

(52) U.S. Cl.
USPC .......... 427/259; 427/98.4; 427/272; 427/384; 427/385.5; 427/418

(58) Field of Classification Search
None
See application file for complete search history.

(56) References Cited

U.S. PATENT DOCUMENTS

| | | | | |
|---|---|---|---|---|
| 5,860,843 | A | * | 1/1999 | Kasahara .......................... 445/24 |
| 6,036,889 | A | * | 3/2000 | Kydd ............................ 252/512 |
| 6,919,158 | B2 | * | 7/2005 | Kawamura et al. ......... 430/270.1 |
| 2006/0223221 | A1 | * | 10/2006 | Ishii ................................ 438/99 |
| 2006/0281333 | A1 | * | 12/2006 | Shin et al. ...................... 438/780 |
| 2007/0259474 | A1 | * | 11/2007 | Shin et al. ........................ 438/99 |
| 2008/0223237 | A1 | * | 9/2008 | Ando et al. .................... 101/333 |

OTHER PUBLICATIONS

Saunders et al. Microporous Polyimide Films for Reduced Dielectric Applications; Sandia National Laboratories Technical Report; published Jan. 1, 1995; available at http://www.osti.gov/bridge/product.biblio.jsp?osti_id=10106624; retrieved Jul. 15, 2012.*
V. Tsakova, How to Affect Number, Size, and Location of Metal Particles Deposited in Conducting Polymer Layers, J. Solid State Electrochem., 2008, 12:1421-1434.*
Kobayashi et al., Electrical Conductivity of Annealed Polyaniline, Journal of Applied Physics, 1993, 74: 296-299.*

* cited by examiner

*Primary Examiner* — Timothy Meeks  
*Assistant Examiner* — Michael P Rodriguez  
(74) *Attorney, Agent, or Firm* — Cantor Colburn LLP

(57) ABSTRACT

Provided is a method for forming a micropattern using a mask template. The method includes: forming a mask template on a substrate, wherein the mask template has an exposure section through which a portion of the substrate is exposed to the exterior and a non-exposure section provided by a polymer material applied on the remaining portion of the substrate; supplying conductive ink to the top of the mask template to deposit the conductive ink on the non-exposure section and on the substrate exposed through the exposure section; and heat treating the conductive ink in order to extract the conductive ink nanoclusters dissolved or dispersed in the conductive ink, wherein the conductive ink nanoclusters disposed on the non-exposure section are bound to the non-exposure section to form an insulating pattern having electrical insulating property, while the conductive ink nanoclusters disposed on the substrate form a conductive pattern having electroconductive property. The method enables formation of a micropattern without any alignment error between patterns in the case of a direct printing process.

9 Claims, 5 Drawing Sheets
(2 of 5 Drawing Sheet(s) Filed in Color)

(a)

(b)

(c)

(d)

(e)

(f)

(a)

(b)

METHOD FOR MAKING FINE PATTERNS USING MASK TEMPLATE

CROSS-REFERENCE TO RELATED APPLICATIONS

This application claims priority under 35 U.S.C. §119 to Korean Patent Application No. 10-2009-0055437, filed on Jun. 22, 2009 in the Korean Intellectual Property Office, the disclosure of which is incorporated herein by reference in its entirety.

TECHNICAL FIELD

The following disclosure relates to a method for forming a micropattern using a mask template, and in particular, to a method for forming a micropattern using a mask template, which enables formation of a micropattern without any alignment error between patterns in the case of a direct printing process.

BACKGROUND

Many attempts have been made continuously to fabricate devices through printing processes in the fields of electronics and displays in order to reduce the cost needed for processing and materials and to allow mass production with ease. Many academic workers have conducted intensive studies related to such direct printing technology.

For example, active studies have conducted to fabricate electronic devices, such as RF filters based on low temperature co-fired ceramic technology, humidity sensors, organic thin film transistors, etc., through roll or ink-jet printing.

However, ink-jet printing processes using liquid ink is not suitable for the fabrication of a micropattern with a scale of several micrometers to several tens micrometers because of variations in liquid ejection condition and ejection direction caused by a wetting phenomenon at a printer nozzle. Particularly, in the case of thin film transistors requiring precise alignment between patterns, there were problems in that the resultant devices may malfunction due to the alignment error.

To solve such problems, active studies have been conducted to develop a patterning method based on self-alignment of liquid ink on a substrate surface-treated with hydrophobic and hydrophilic regions. However, the above method includes a complicated process because it requires hydrophilic and hydrophobic pretreatment. Moreover, as shown in FIG. 1, additives having hydrophobic properties are diffused to the surface of a substrate during the heat treatment, thereby causing a so-called dewetting phenomenon of ink from the edges of the pattern.

SUMMARY

An embodiment of the present invention is directed to providing a method for forming a micropattern using a mask template, which enables formation of a micropattern without dewetting of ink and requires no complicated pretreatment.

In one general aspect, a method for forming a micropattern using a mask template includes:

forming a mask template on a substrate, wherein the mask template has an exposure section through which a portion of the substrate is exposed to the exterior and a non-exposure section provided by a polymer material applied on the remaining portion of the substrate;

supplying conductive ink to the top of the mask template to deposit the conductive ink on the non-exposure section and on the substrate exposed through the exposure section; and heat treating the conductive ink in order to extract the conductive ink nanoclusters dissolved or dispersed in the conductive ink, wherein the conductive ink nanoclusters disposed on the non-exposure section are bound to the non-exposure section to form an insulating pattern having electrical insulating property, while the conductive ink nanoclusters disposed on the substrate form a conductive pattern having electroconductive property.

In one embodiment, the insulating pattern may be disposed intermittently in the polymer material by the conductive ink nanoclusters penetrating into the interstitial spaces of the polymer material.

In another embodiment, the polymer material may be present as particles and exhibit insulating property by itself or through the reaction with the conductive ink.

In still another embodiment, the polymer material may include polyaniline.

In still another embodiment, when forming the mask template, the polymer material may be deposited on the total surface of the substrate via any one process of spin coating and spray coating, and when depositing the ink, the conductive ink may be deposited on the non-exposure section and the substrate via any one process of spin coating and spray coating.

In still another embodiment, the mask template may be formed by an imprinting process after depositing the polymer material on the total surface of the substrate.

In still another embodiment, the mask template may be formed by depositing the polymer material on the total surface of the substrate and then irradiating laser beams to the polymer material to remove the polymer material.

In still another embodiment, the mask template may be formed by any one process selected from screen printing, gravure printing, flexo printing, offset printing and gravure-offset printing.

In still another embodiment, the heat treatment may be carried out by heating the conductive ink at a temperature between 150° C. and 350° C.

In yet another embodiment, the conductive ink may be any one of organometallic silver compound ink in a solution state and ink containing metal nanoclusters dispersed therein.

According to the present invention, there is provided a method for forming a micropattern using a mask template, which enables formation of a micropattern while avoiding alignment error between patterns.

It is possible to form a micropattern on a flexible substrate by using polyaniline as a polymer material.

It is also possible to fabricate a mask template via a process selected from the group consisting of gravure printing, flexo printing, offset printing, gravure-offset printing, spin coating, spray coating and imprinting processes.

It is also possible to remove the polymer material with ease by laser beams.

It is also possible to activate the polymer material under an optimized condition by carrying out the heat treatment at 150° C. to 350° C.

Further, it is possible to realize a circuit with high conductivity by using organometallic silver compound ink in a solution state or ink containing silver nanoclusters dispersed therein as a conductive ink.

Other features and aspects will be apparent from the following detailed description, the drawings, and the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF EMBODIMENTS

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, exemplary embodiments will be described in detail with reference to the accompanying drawings.

Figure 1:
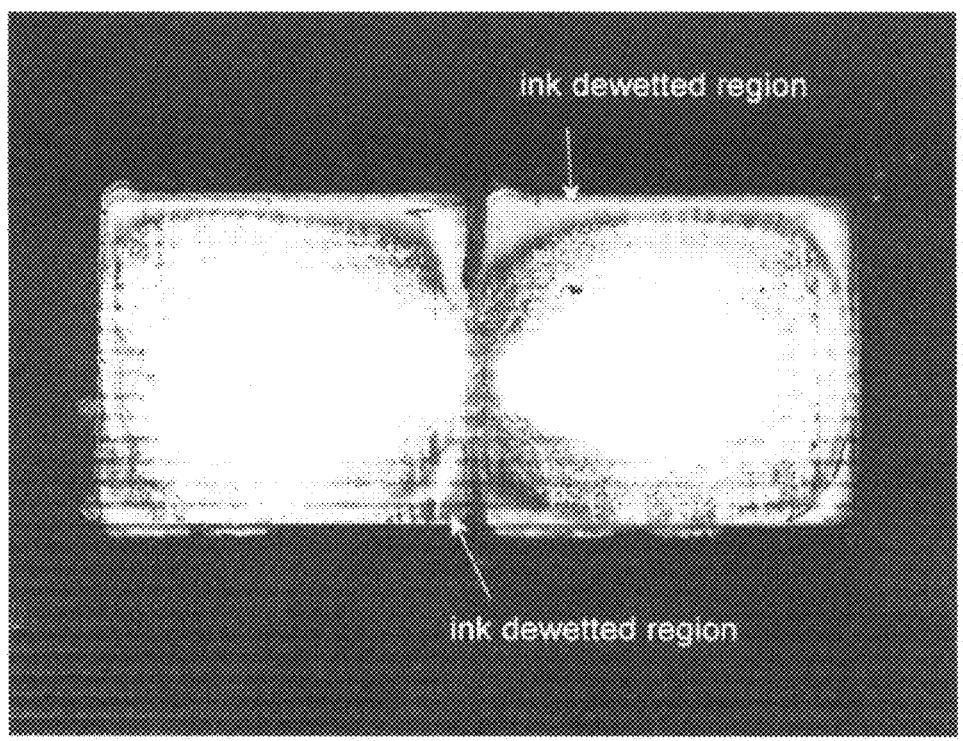
FIG. 1 is a photographic view showing the ink dewetting occurring in a method for forming a micropattern according to the related art.
Figure 2:
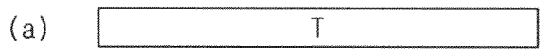
FIG. 2 is a schematic view showing a method for forming a micropattern using a mask template according to an exemplary embodiment.
Figure 2:
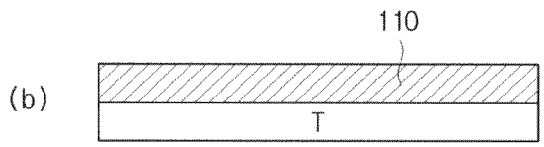
Figure 2:
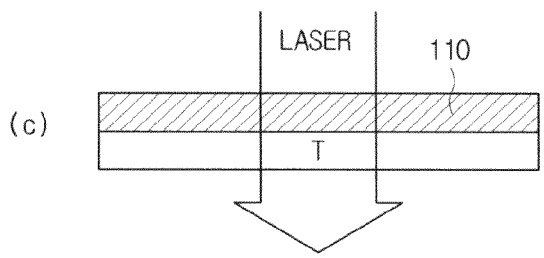
Figure 2:
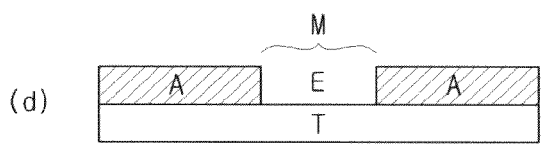
Figure 2:
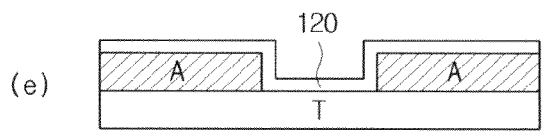
Figure 2:
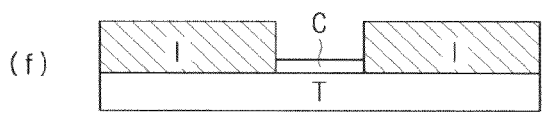

FIG. 2 is a schematic view showing a method for forming a micropattern using a mask template according to an exemplary embodiment.

Referring to FIG. 2, the method S100 for forming a micropattern using a mask template includes an operation S110 of forming a mask template, an operation S120 of depositing ink and an operation S130 of carrying out heat treatment.

In the operation S110 of forming a mask template, a polymer material 110 is deposited first on the top of a substrate T. Such deposition of the polymer material 110 is based on spin coating in which a material is applied by centrifugal force. In this embodiment, a spin coater is set at 500 rpm to apply the polymer material 110 on the top of the substrate T for 20 seconds.

In this embodiment, the polymer material 110 deposited on the substrate T is polyaniline that is obtained in a simple manner and has excellent thermal properties as compared with other polymer materials. Polyaniline is deposited on the substrate T in the form of emeraldine base.

The emeraldine base-form polyaniline is leuco-emeraldine base-form polyaniline in a partially oxidized state and has conductivity and a green color. Therefore, when the emeraldine base-form polyaniline is deposited on the substrate T, the substrate T is green colored as a whole.

After depositing polyaniline on the substrate T, polyaniline is heated at 170° C. for 5 minutes to remove the organic solvent remaining therein while increasing the resistance of polyaniline against the organic solvent.

Then, laser beams with a wavelength range of about 532 nm are irradiated to the top of the polyaniline deposited on the substrate T to remove a part of polyaniline. The removal of polyaniline provides an exposure section E through which a portion of the substrate T is exposed to the exterior. In addition, the remaining portion of the substrate T provides a non-exposure section A on which polyaniline is not removed but still remains on the substrate T. The exposure section E in combination with the non-exposure section A forms a mask template M.

In the operation S120 of depositing ink, conductive ink 120 is deposited on the top of the mask template M. In this embodiment, the conductive ink 120 is deposited by the above-mentioned spin coating process. The conductive ink 120 is applied to the substrate exposed to the exterior through the exposure section E and to the top of the non-exposure section A on which polyaniline is still deposited for 20 seconds by a spin coater set at 500 rpm.

The conductive ink 120 deposited according to this embodiment is provided as a solution-type organometallic silver compound obtained by dissolving and mixing ink into and with an organic solvent. Particular examples of the organic solvent used for dissolving ink include alcohols, toluene, xylene, etc.

In the operation S130 of carrying out heat treatment, the organometallic silver compound ink is heated at a temperature ranging from 150° C. to 350° C. for an optimized time corresponding thereto to extract organometallic silver compound nanoclusters dissolved in the organometallic silver compound ink.

When carrying out heat treatment S130 in the state of (e) as shown in FIG. 2, the nanoclusters extracted from the organometallic silver compound ink applied on the top of the substrate exposed through the exposure section E agglomerate together to form a conductive network, thereby forming a conductive pattern C with electroconductivity, as shown in (f) of FIG. 2.

In addition, after the operation S130 of carrying out heat treatment, the organometallic silver compound ink and polyaniline deposited on the non-exposure section A undergo a change.

Figure 3:
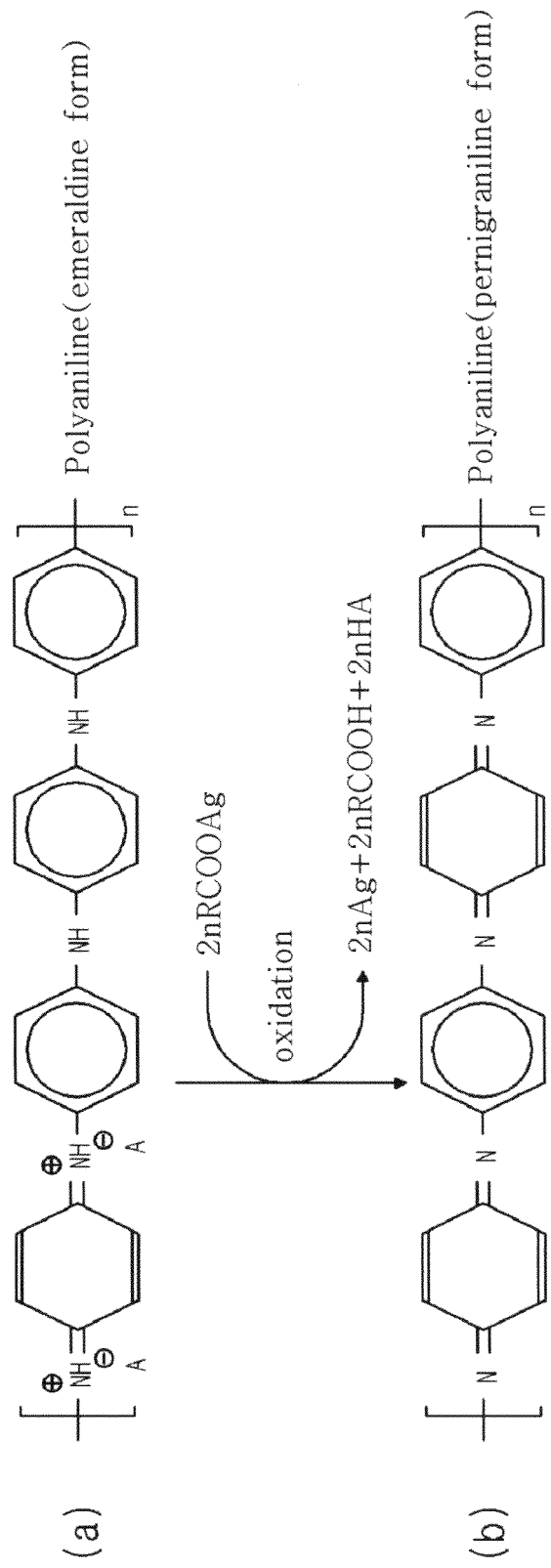
FIG. 3 is a reaction scheme illustrating the oxidation of emeraldine base-form polyaniline into pernigraniline base-form polyaniline.

FIG. 3 is a reaction scheme illustrating the oxidation of emeraldine base-form polyaniline into pernigraniline base-form polyaniline.

Referring to FIG. 3, after the heat treatment S130, emeraldine base-form polyaniline is oxidized completely into pernigraniline base-form polyaniline.

The pernigraniline base-form polyaniline has no electroconductivity due to its large surface resistance and shows a dark blue color turned from a green color.

The organometallic silver compound nanoclusters applied on the top of the polyaniline penetrate into the pernigraniline base-form polyaniline, and thus it is not possible for the nanoclusters to form an electroconductive network among them. Since the organometallic silver compound nanoclusters provide electroconductivity only when they are agglomerated, they realize no electroconductivity herein. Rather, the polyaniline and the organometallic silver compound nanoclusters penetrating therein exhibit electrically insulating property as a whole, thereby forming an insulating pattern.

Figure 4:
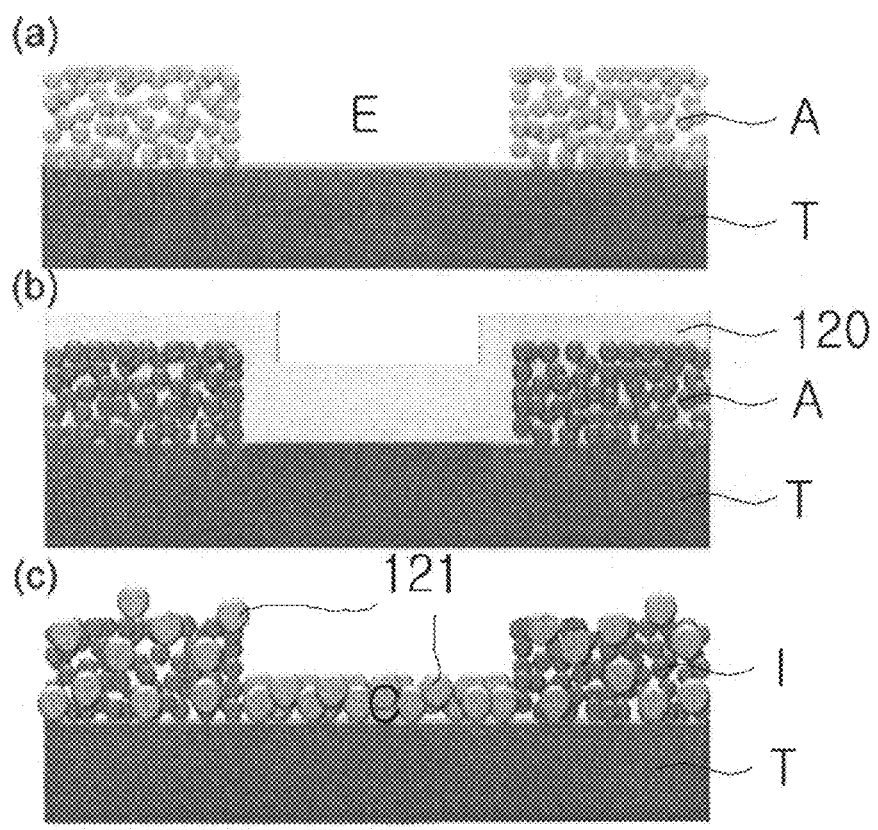
FIG. 4 is a schematic view illustrating the process of extracting conductive ink nanoclusters dissolved in conductive ink and forming a conductive pattern and an insulating pattern.
Figure 5:
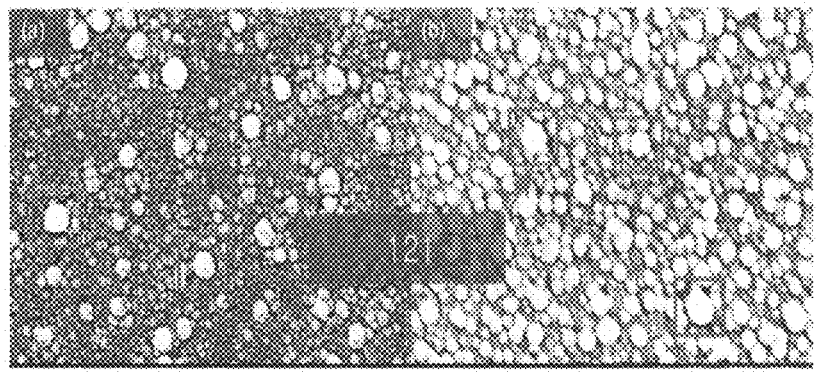
FIG. 5 is a schematic view illustrating the conductive ink nanoclusters penetrating into the interstitial spaces of a polymer material, after the heat treatment as shown in FIG. 2.

FIG. 4 is a schematic view illustrating the process of extracting conductive ink nanoclusters 121 dissolved in the conductive ink and forming a conductive pattern C and an insulating pattern I. FIG. 5 is a schematic view illustrating the conductive ink nanoclusters 121 penetrating into the interstitial spaces of the polymer material, after the heat treatment as shown in FIG. 2. Referring to the portion (c) of FIG. 4 and FIG. 5, the conductive ink nanoclusters 121 deposited on the non-exposure section A penetrate into the polymer material 120 and are not able to form a network among them. However, the conductive ink nanoclusters 121 deposited directly on the substrate T agglomerate together to form a network.

Figure 6:
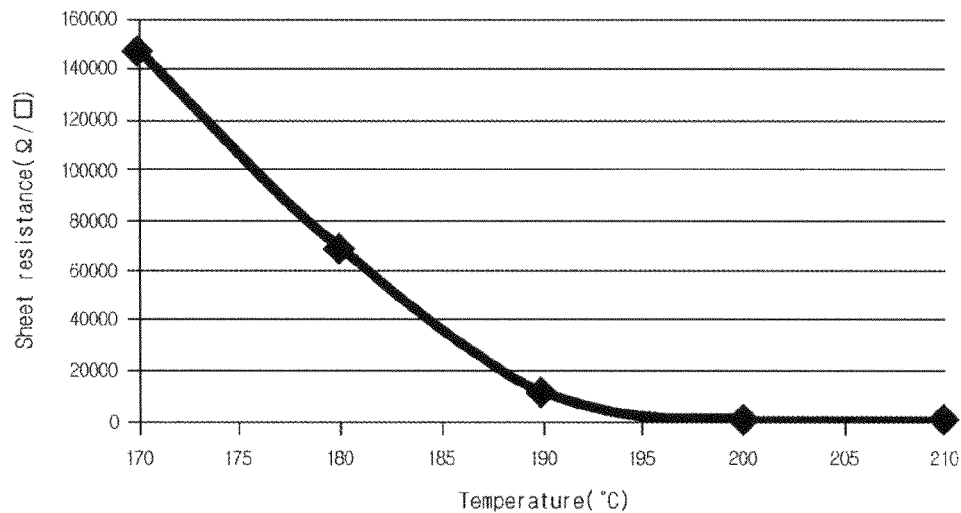
FIG. 6 shows a graph (portion (a)) of the surface resistance of the conductive pattern and a graph (portion (b)) of the surface resistance of the insulating pattern, after the heat treatment as shown in FIG. 2.
Figure 6:
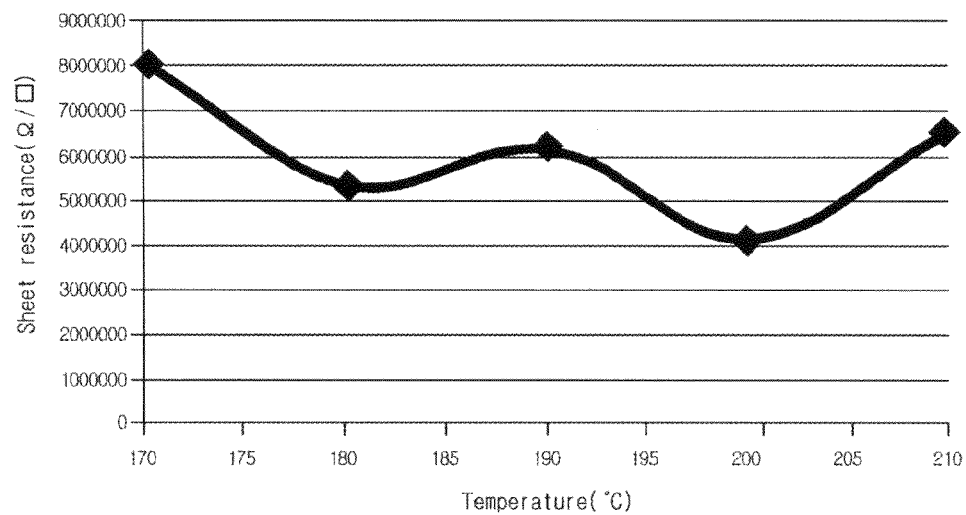

The above-mentioned phenomenon may be determined by measuring the surface resistance values of the conductive pattern and the insulating pattern provided by the materials described herein. FIG. 6 shows a graph (portion (a)) of the surface resistance of the conductive pattern and a graph (portion (b)) of the surface resistance of the insulating pattern, after the heat treatment as shown in FIG. 2. Referring to FIG. 6, the conductive pattern and the insulating pattern have a surface resistance of $2.57\pm0.06\Omega/\square$ and $6.01\pm1.46$ M$\Omega/\square$ or higher, respectively, as measured after carrying out heat treatment at 210° C. for 20 minutes.

In other words, as can be seen from the experimental result, the polyaniline and the organometallic silver compound nanoclusters form an electrically insulating pattern through the chemical reaction between them and the physical isolation. On the contrary, the organometallic silver compound nanoclusters deposited on the substrate exposed to the exterior through the exposure section agglomerate together to form an electrically conductive pattern. In this manner, it is possible to form a micropattern with ease without removing the organometallic silver compound ink deposited on the substrate requiring insulating property, while avoiding alignment error.

In the above-described embodiment, deposition of a polymer material 110 based on spin coating and removal of the polymer material using laser beams are used to form a mask template in the operation S110 of forming a mask template. However, the polymer material 110 may be deposited on the substrate via a spray coating process and subjected to imprinting to fabricate a mask template.

In addition, instead of such a step-wise process including the deposition and the removal of the polymer material, a single process, such as screen printing, inkjet printing, gravure printing, offset printing, flexo printing or gravure-offset printing may be used to fabricate a mask template.

Although the embodiment disclosed herein utilizes polyaniline as a polymer material 110 deposited on the substrate, any polymer material may be used for this purpose as long as it is present as particles, and show electrically insulating property by itself or through the chemical reaction with the conductive ink 120 deposited in the operation S120 of deposing ink.

In the operation S120 of depositing ink, the conductive ink 120 is deposited via a spin coating process herein. However, the conductive ink may be deposited via a spray coating process.

The conductive ink 120 may be an ink composition containing silver nanoclusters. Such an ink composition containing silver nanoclusters may be obtained by a method of preparing powder via gas phase condensation or a nano-colloid method based on liquid phase reduction. In addition, the ink composition may further include a surfactant in order to allow the high-concentration silver clusters to maintain dispersion stability for a long time. The surfactant preferably has a molecular weight of 50,000 or less, a narrow molecular weight distribution and a boiling point of 80-250° C. so that it is removed with ease in the operation S130 of carrying out heat treatment.

Further, the conductive ink 120 may be a metallic or non-metallic, transparent, translucent, opaque or highly reflective material including gold, zinc, platinum, nickel, copper, graphite, indium tin oxide (ITO), carbon, carbon nanotubes or a combination thereof, depending on the particular type of the micropattern. Various types of conductive ink may be used without departing from the technical spirit of the present invention.

While the present invention has been described with respect to the specific embodiments, it will be apparent to those skilled in the art that various changes and modifications may be made without departing from the spirit and scope of the invention as defined in the following claims.

What is claimed is:

1. A method for forming a micropattern using a mask template, comprising:
    forming the mask template on a substrate, wherein the mask template has an exposure section through which a portion of the substrate is exposed to an exterior and a non-exposure section provided by a polymer material applied on a remaining portion of the substrate;
    supplying conductive ink to a top of the mask template to deposit the conductive ink on the non-exposure section and on the substrate exposed through the exposure section; and
    heat treating the conductive ink in order to extract conductive ink nanoclusters dissolved or dispersed in the conductive ink, wherein the conductive ink nanoclusters disposed on the non-exposure section are bound to the non-exposure section to form an insulating pattern having electrical insulating property, while the conductive ink nanoclusters disposed on the substrate form a conductive pattern having electro conductive property,
    wherein the polymer material is polyaniline.

2. The method for forming the micropattern using the mask template according to claim 1, wherein the insulating pattern has electrically insulating property as a whole by the conductive ink nanoclusters penetrating into interstitial spaces of the polymer material so that they are disposed intermittently in the polymer material.

3. The method for forming the micropattern using the mask template according to claim 2, wherein the polymer material is present as particles and exhibits electrically insulating property by itself or through a reaction with the conductive ink.

4. The method for forming the micropattern using the mask template according to claim 1, wherein said forming of the mask template is carried out by depositing the polymer material on a total surface of the substrate via any one process of spin coating and spray coating, the exposure section and non-exposure sections are formed by removing of a part of the polymer material on the substrate, and said depositing of the ink is carried out by depositing the conductive ink on the non-exposure section and the substrate via any one process of spin coating and spray coating.

5. The method for forming the micropattern using the mask template according to claim 1, wherein said forming of the mask template is carried out by an imprinting process after depositing the polymer material on a total surface of the substrate.

6. The method for forming the micropattern using the mask template according to claim 1, wherein said forming of the mask template is carried out by depositing the polymer material on a total surface of the substrate and then irradiating laser beams to the polymer material to remove the polymer material.

7. The method for forming the micropattern using the mask template according to claim 1, wherein said forming of the mask template is carried out by any one process selected from screen printing, gravure printing, flexo printing, offset printing and gravure-offset printing.

8. The method for forming the micropattern using the mask template according to claim 1, wherein said heat treatment is carried out by heating the conductive ink at a temperature between 150° C. and 350° C.

9. The method for forming the micropattern using the mask template according to claim 1, wherein the conductive ink is any one of an organometallic silver compound ink containing organometallic silver compound nanoclusters dissolved therein in a solution state and an ink containing metal nanoclusters dispersed therein.

* * * * *